(12) United States Patent
Ikkai et al.

(10) Patent No.: US 6,579,376 B1
(45) Date of Patent: Jun. 17, 2003

(54) METHOD AND APPARATUS FOR OPENING RESIN-SEALED BODY

(75) Inventors: Kenji Ikkai, Sagamihara (JP); Hiroshi Yamamoto, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 177 days.

(21) Appl. No.: 09/635,004

(22) Filed: Aug. 8, 2000

(30) Foreign Application Priority Data

Aug. 16, 1999 (JP) ............................................. 11-229908

(51) Int. Cl.⁷ ................................................. B08B 7/04
(52) U.S. Cl. ............................. 134/1; 134/1.3; 134/18; 134/26
(58) Field of Search ............................. 134/1, 1.3, 26, 134/6, 18; 438/4, 7, 14

(56) References Cited

U.S. PATENT DOCUMENTS 4,786,358 A * 11/1988 Yamazaki et al. ............ 216/48
5,700,697 A * 12/1997 Dlugokecki ................ 438/115
6,335,208 B1 * 1/2002 Lowry ......................... 216/65

* cited by examiner

Primary Examiner—Alexander Markoff
(74) Attorney, Agent, or Firm—Fitzpatrick, Cella, Harper & Scinto

(57) ABSTRACT

This invention provides a method and apparatus for opening a resin-sealed body with which, when performing failure analysis and the like of a predetermined circuit including an integrated circuit, movement of an upper aluminum interconnection is prevented and excessive drilling and removal are prevented. In order to open a sample obtained by sealing, with a resin (1), an integrated circuit (2) covered with a polyimide layer (7), while observing a drilling state in enlargement with a stereomicroscope (15), the sealing resin (1) is drilled by the depth of a gold ball (4), is partially drilled by laser irradiation, and is dipped in a beaker (70) which stores a liquid (8) that does not dissolve the polyimide layer (7) and to which ultrasonic vibration is applied.

5 Claims, 7 Drawing Sheets

F I G. 5
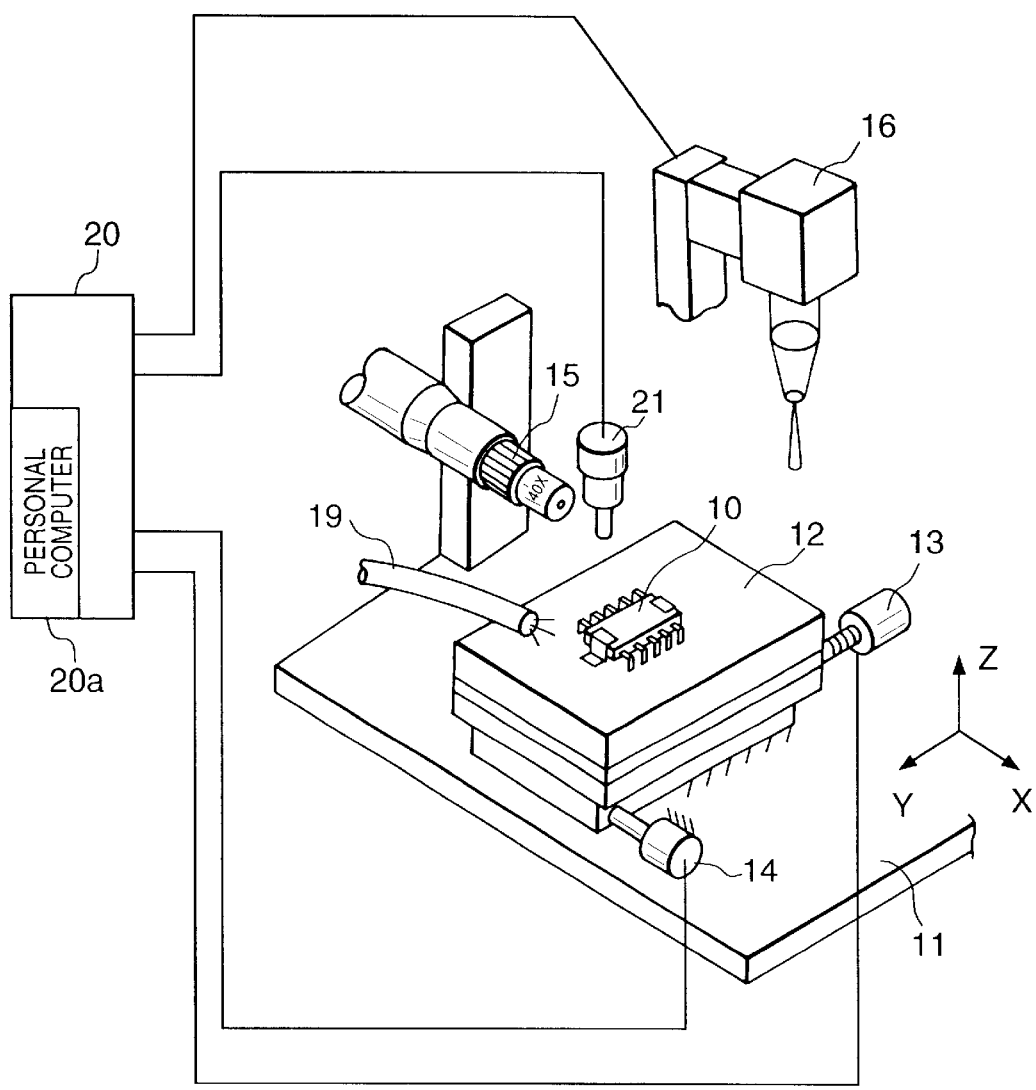

METHOD AND APPARATUS FOR OPENING RESIN-SEALED BODY

FIELD OF THE INVENTION

The present invention relates to a method and apparatus for opening a resin-sealed body.

BACKGROUND OF THE INVENTION

Conventionally, when an integrated circuit chip, which uses polyimide to form its protective film and interlevel film and is sealed with a resin, is to be opened, a recess is formed by machining on the surface of the sealing resin above the integrated circuit chip in advance by using a drilling means such as a grinder, and after that fuming nitric acid is dropped into the recess formed by machining, or the whole integrated circuit is dipped in fuming nitric acid filled in a container, thereby dissolving and removing the sealing resin.

As another opening method, a method of mechanically removing the sealing resin on the integrated circuit chip completely with a polisher is known.

SUMMARY OF THE INVENTION

With the dissolving and removing method described above, particularly in the case of a resin-sealed integrated circuit using polyimide to form its protective film and interlevel film, the polyimide layers are undesirably dissolved by fuming nitric acid. Accordingly, aluminum interconnections sandwiched by the polyimide layers sometimes move as the polyimide layers are dissolved.

If the method of mechanically removing the sealing resin on the integrated circuit chip by using the polisher is employed, when a sample is to be fixed with respect to the polisher, sometimes the sample is not precisely horizontal with respect to the moving direction of the wheel of the polisher, or excessive grinding is difficult to avoid. For this reason, part of an upper aluminum interconnection which is originally intended to be left is undesirably drilled and removed.

According to a so-called heating and mechanical breaking method, which is generally employed in opening a polyimide-free integrated circuit, of removing the sealing resin of the integrated circuit by temporarily heating the integrated circuit and after that applying a mechanical stress to it, the polyimide layers are undesirably deformed by heating, and the upper aluminum interconnection originally intended to be left is accordingly deformed, thereby causing partial disconnection.

As mentioned above, with any of the methods described above, the upper aluminum interconnection undesirably moves, or part of the aluminum interconnection is undesirably drilled and removed. Hence, when failure analysis and the like of the integrated circuit are to be performed, the aluminum interconnection structure cannot be grasped, or the disconnected aluminum interconnection cannot be observed.

The present invention has been made in view of the above problems, and has as its object to provide a method and apparatus for opening a resin-sealed body, with which when failure analysis and the like of a predetermined circuit including an integrated circuit are to be performed, movement of an upper aluminum interconnection is prevented and excessive drilling and removal are prevented, so that an aluminum interconnection structure can be grasped and a disconnected aluminum interconnection can be observed.

In order to solve the above problems and to achieve the above object, according to the present invention, there is provided an apparatus for opening a resin-sealed body obtained by sealing a predetermined circuit, including an integrated circuit covered with a layer/film member, with a sealing resin, characterized by comprising drilling apparatus for drilling the sealing resin on the layer/film member by a depth corresponding to a predetermined thickness, observing apparatus for observing a drilling state in enlargement, laser irradiation apparatus for partially drilling the drilled sealing resin by laser irradiation up to the layer/film member, and container apparatus for storing a liquid that does not dissolve the layer/film member, the resin-sealed body being dipped in the liquid and ultrasonic vibration being applied to the container apparatus so that the sealing resin is removed from the layer/film member.

The present invention is also characterized in that the depth corresponding to the predetermined thickness is a depth equal to a diameter of a gold ball of a gold wire that connects the predetermined circuit to a lead.

The present invention is also characterized in that the laser irradiation apparatus has a moving mechanism for performing partial drilling while shifting a position thereof, and a YAG laser generator.

The present invention is also characterized in that the layer/film member is made of polyimide, and the YAG laser generator has an output energy of not more than 90 mJ.

The present invention is also characterized in that the liquid does not chemically dissolve the layer/film member.

According to the present invention, there is also provided a method of opening a resin-sealed body obtained by sealing a predetermined circuit, including an integrated circuit covered with a layer/film member, with a sealing resin, characterized by comprising the steps of drilling the sealing resin on the layer/film member with drilling means by a depth corresponding to a predetermined thickness, observing a drilling state in enlargement with observing apparatus, partially drilling the drilled sealing resin with laser irradiation apparatus by laser irradiation up to the layer/film member, and removing the sealing resin from the layer/film member with container apparatus which stores a liquid that does not dissolve the layer/film member, the resin-sealed body being dipped in the liquid and ultrasonic vibration being applied to the container apparatus.

The present invention is also characterized in that the drilling step comprises performing drilling by a depth corresponding to the predetermined thickness and equal to a diameter of a gold ball of a gold wire that connects the predetermined circuit to a lead.

The present invention is also characterized in that the step using the laser irradiation apparatus comprises performing partial drilling while shifting an irradiation position with a YAG laser generator having a moving mechanism.

The present invention is also characterized in that partial drilling is performed with one stroke.

The present invention is also characterized in that the layer/film member is made of polyimide, and in the step using the laser irradiation apparatus, the YAG laser generator has an output energy of not more than 90 mJ.

The present invention is also characterized in that in the step using the container apparatus, the liquid does not chemically dissolve the layer/film member.

Other features and advantages of the present invention will be apparent from the following description taken in conjunction with the accompanying drawings, in which like

BRIEF DESCRIPTION OF THE DRAWINGS

FIG. 5 is a perspective view of the outer appearance of an opening apparatus according to the third embodiment of the present invention;

DETAILED DESCRIPTION OF THE PREFERRED EMBODIMENTS

The preferred embodiments of the present invention will be described in detail with reference to the accompanying drawings.

Figure 1:
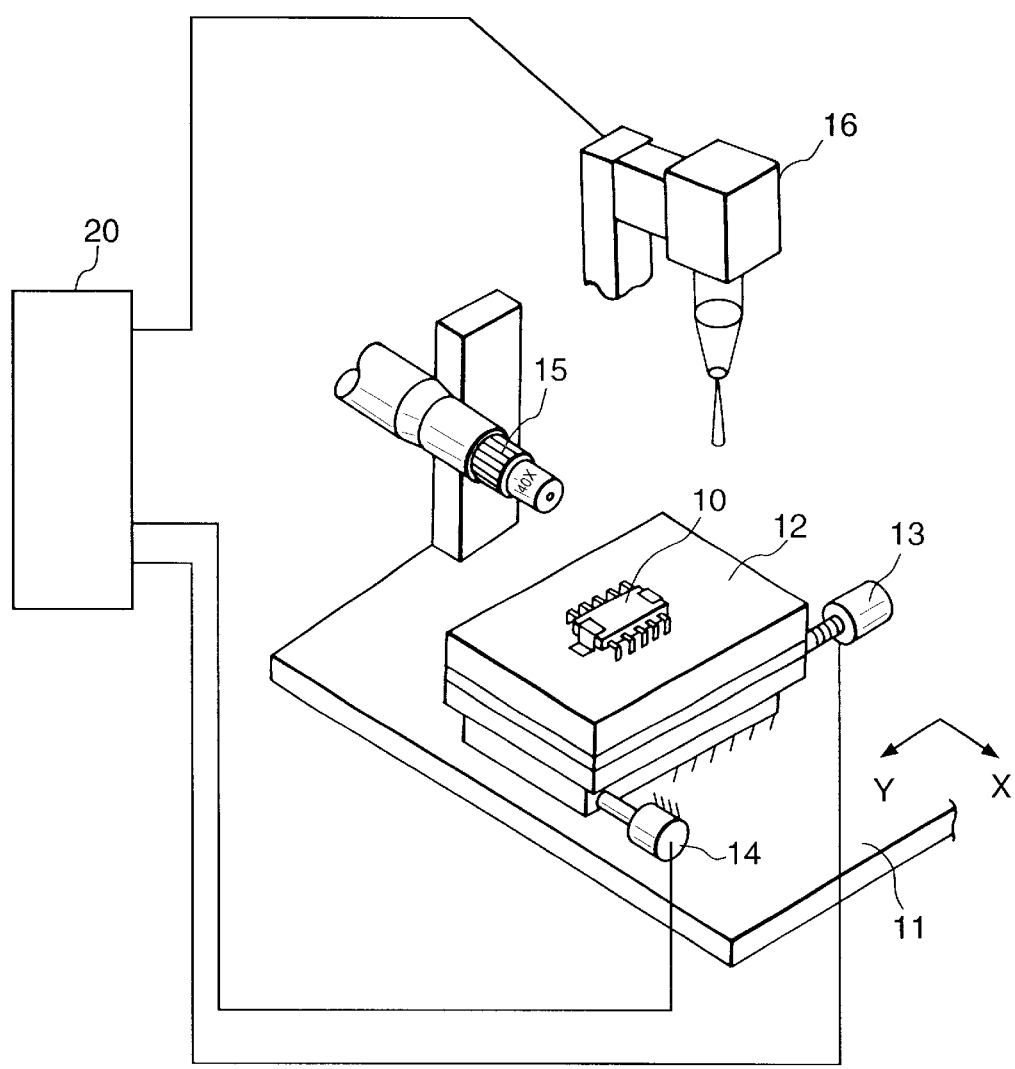
FIG. 1 is a perspective view of the outer appearance of an opening apparatus according to the first embodiment of the present invention.

FIG. 1 is a perspective view of the outer appearance of a resin-sealed body opening apparatus according to the first embodiment of the present invention. Referring to FIG. 1, a sample (integrated circuit) 10 as a resin-sealed body is fixed immobile on an X-Y stage 12 with its machining target surface facing up, as shown in FIG. 1. The X-Y stage 12 is formed on a slide base fixed to a base 11, and drives the sample 10 in X and Y directions with motors 13 and 14.

A stereomicroscope 15 serving as an observation means is fixed onto the base 11 through a support column, and can observe the drilled state in enlargement.

A laser irradiation unit 16, which partially drills the drilled sample. 10 by laser radiation up to polyimide that forms a layer/film member, is fixed to another portion of the base 11 with a support-column, so that the X-Y stage 12 can be irradiated with the laser.

A container for storing a liquid, e.g., acetone, which does not dissolve the layer/film member, and removing the sealing resin which is left as a carbonized state after laser irradiation upon application with ultrasonic vibration, is provided near the base 11. The motors 13 and 14 and laser irradiation unit 16 are connected to a controller 20.

An apparatus for opening an integrated circuit which uses polyimide to form its protective film and interlevel film and is sealed with a resin, according to the first embodiment of the present invention, will be described with reference to FIGS. 2A to 2D.

Figure 2A:
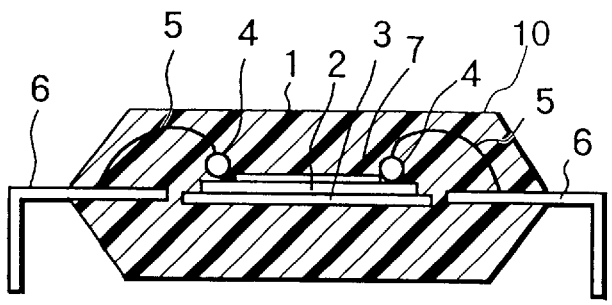
FIG. 2A is a sectional view showing the internal structure of an integrated circuit according to the present invention.

According to the first embodiment, referring to FIG. 2A, a commercially available LB1668 (motordriver) was prepared as a sample (integrated circuit) 10 in which an integrated circuit chip 2, using polyimide 7 to form its protective film and interlevel film, was formed on a die frame 3 and sealed with a resin. This LB1668 was set under the stereomicroscope 15 (with a maximum magnification of ×40) with the upper surface of the integrated circuit chip 2 facing up. Sealing resin 1 above and around the integrated circuit chip 2 was removed with a manual metal file while checking the position of the integrated circuit chip 2, until gold balls 4 of gold wires 5 that connected the integrated circuit chip 2 to leads 6 were seen.

Figure 2B:
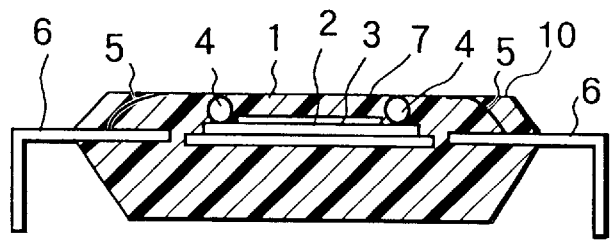
FIG. 2B is a sectional view showing the integrated after drilling.

The drilling operation was manually done by using the metal file as the drilling means. The drilling operation must be performed such that heat generated by the friction between the drilling means and resin during drilling will not be conducted to the integrated circuit chip 2 during drilling. The drilling means is not limited to a metal file, but sand paper, water paper, or the like may be used as far as it satisfies this condition. Regarding the portion around the integrated circuit chip 2, it is sufficient if it is drilled until the position of the integrated circuit chip 2 can be confirmed and whether the sealing resin 1 left above the integrated circuit chip 2 has a predetermined thickness above the integrated circuit chip 2 can be measured. The portion around the integrated circuit chip 2 need not be entirely drilled. In this manner, the sealing resin 1 above the integrated circuit chip 2 is drilled to a predetermined thickness while checking the integrated circuit chip 2 with the stereomicroscope 15. As a result, the state shown in FIG. 2B is obtained.

Figure 2C:
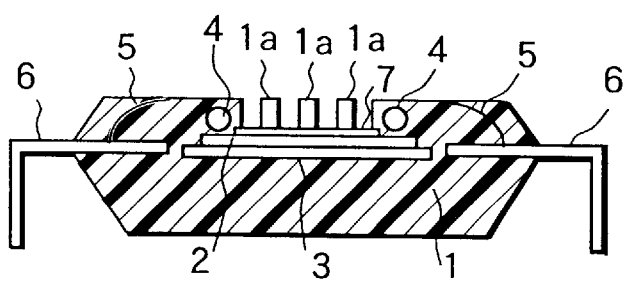
FIG. 2C is a sectional view showing the integrated circuit after being irradiated by a laser.

This integrated circuit chip 2 was set on the X-Y stage 12 of a commercially available pulse excitation YAG laser (a 1.06 ($\mu$m)-wavelength glass laser of near-infrared radiation using an Nd+glass rod) irradiation unit. The integrated circuit chip 2 was irradiated with a laser beam vertically while checking-the irradiation position on the integrated circuit chip 2 with a metallurgical microscope, thereby performing partial laser machining, as shown in FIG. 2C. The objective lens of the laser had a magnification of 20×. The intensity of the laser was controlled by the voltage, and its value was set to 0.9 (kvolt) or less. Every time laser irradiation is to be performed, the irradiated position was determined by a microscope added to the apparatus while checking how remaining sealing resin portions 1a were removed. This operation was repeated.

At the portion irradiated with the laser, the sealing resin 1 was scorched by the laser with its central portion being exposed, and resin being carbonized was confirmed around the laser-irradiated portion. At the exposed central portion, an aluminum interconnection in a polyimide layer or a circuit under the polyimide layer was seen depending on the location. Microscopic observation confirmed that such an aluminum interconnection and underlying circuit did not extend through the polyimide layer 7.

Figure 2D:
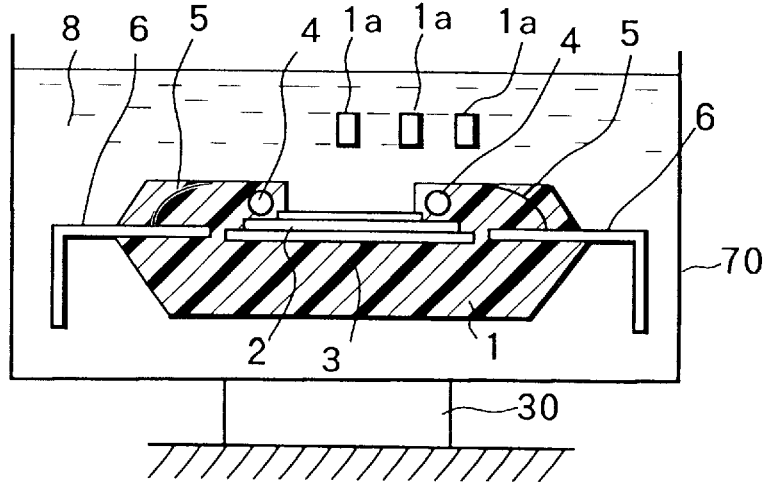
FIG. 2D is a sectional view showing the integrated circuit during ultrasonic cleaning.

The whole integrated circuit was dipped in acetone 8 filled in advance in a glass beaker 70, and was subjected to a commercially available ultrasonic cleaner 30 for about 1 min, so that the remaining sealing resin portions 1a were able to be removed from the surface of the polyimide layer 7, as shown in FIG. 2D. In this embodiment, acetone was used as a liquid that did not chemically dissolve a polyimide layer, as described above. However, any other solvent may be used as far as it satisfies the above condition.

After that, this integrated circuit chip was removed from the beaker 70, and its surface was observed with the metallurgical microscope. It was confirmed that the resin 1 and carbonized resin, which were left on the surface of the integrated circuit chip 2 after former laser irradiation, were removed, and that inversely the polyimide layers or aluminum interconnections were not removed or moved.

Figure 3:
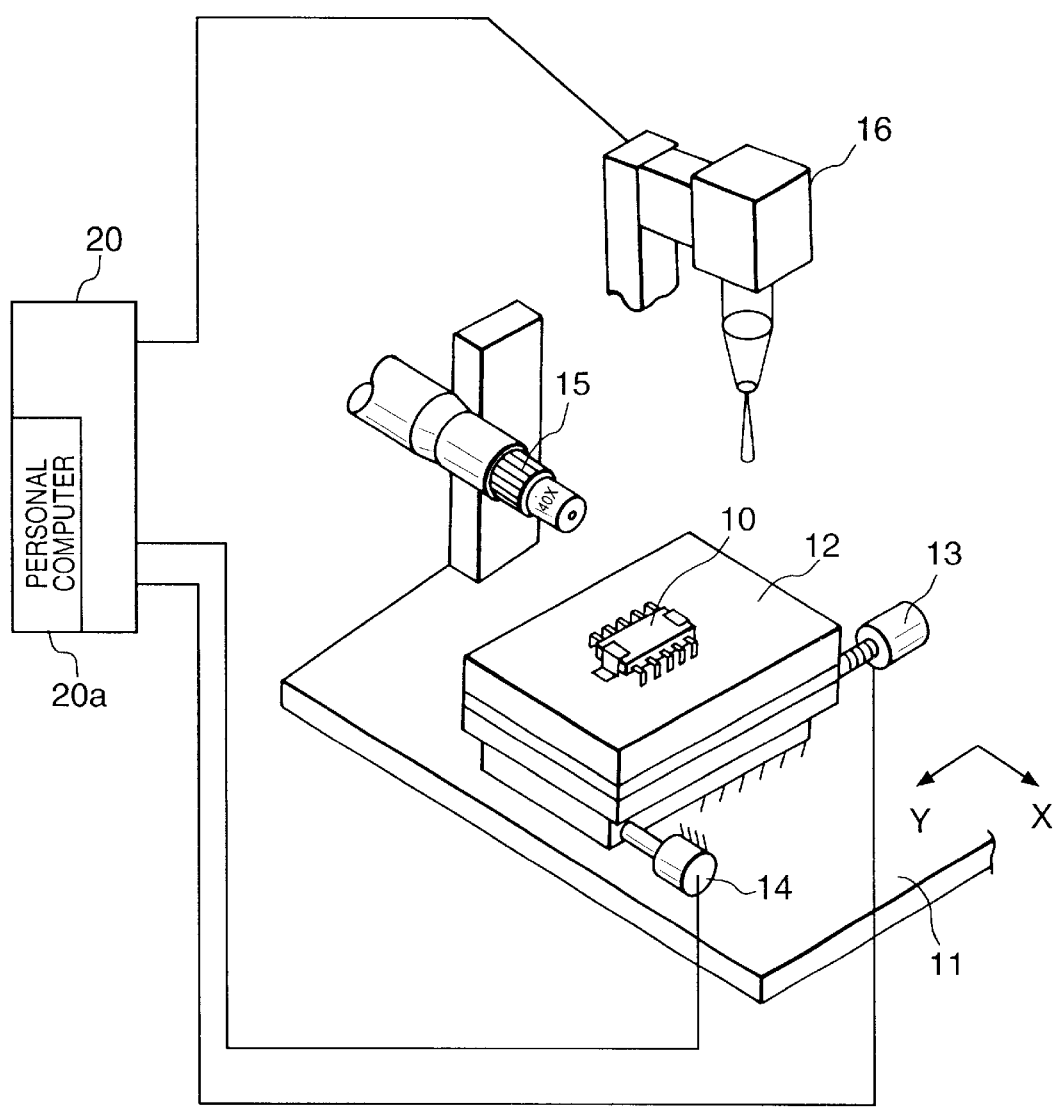
FIG. 3 is a perspective view of the outer appearance of an opening apparatus according to the second embodiment of the present invention.
Figure 4:
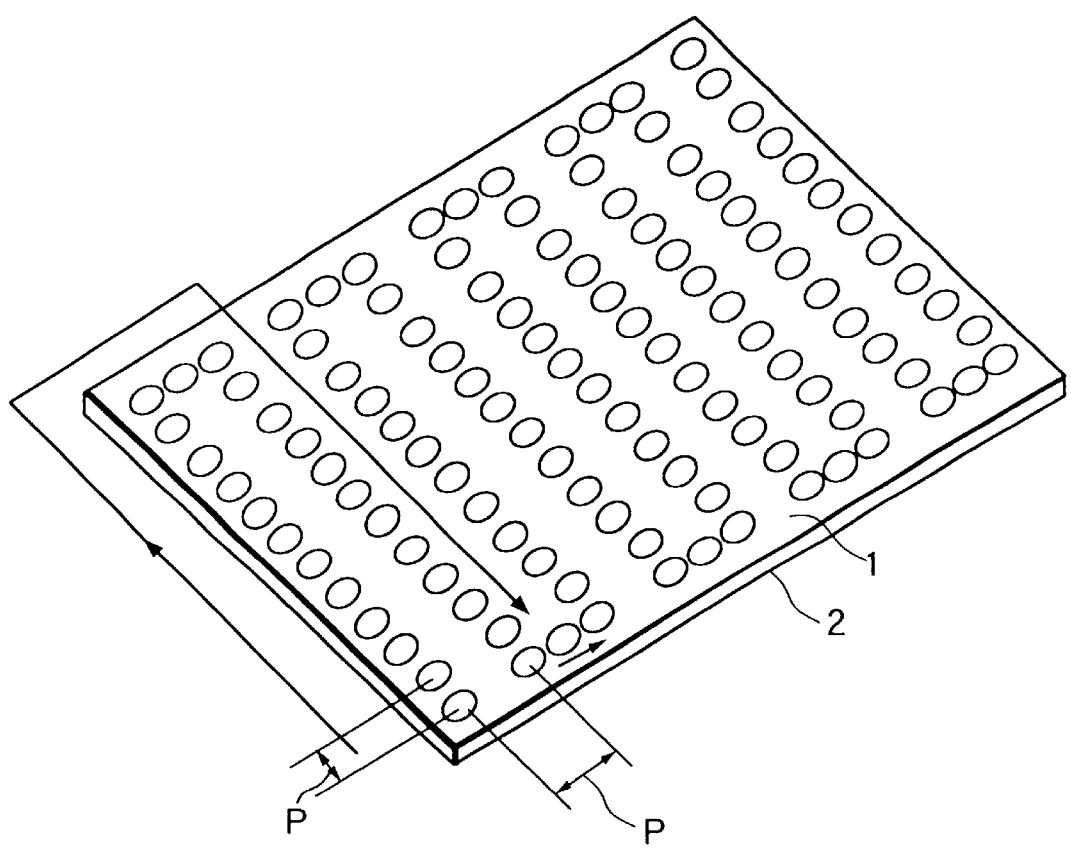
FIG. 4 is a perspective view showing positions irradiated with the laser beam with circles.

The second embodiment of the present invention will be described with reference to FIGS. 2A to 2D and FIGS. 3 and 4. The second embodiment is different from the first embodiment in that a program-controlled X-Y stage is used in the laser irradiation step. More specifically, an opening apparatus shown in FIG. 3 is different from that of FIG. 1 in that its controller 20 has a program-input personal computer 20a. A description on portions of FIG. 3 that are identical to those of FIG. 1 will be omitted.

In the same manner as in the first embodiment, an LB1668 (motor driver) was prepared as a sample (integrated circuit) 10. This LB1668 was set with the upper surface of an integrated circuit chip 2 facing up. Sealing resin 1 above and around the integrated circuit chip 2 was removed with a manual metal file while checking the position of the integrated circuit chip 2, until gold balls 4 of gold wires 5 were seen.

A program was input to the personal computer 20a in advance. The integrated circuit chip 2 was intermittently moved on an. X-Y stage 12 controlled by the program of the controller 20. Every time the integrated circuit chip 2 was moved, a laser with an adjusted output energy irradiated remaining sealing resin portions 1a. More specifically, the integrated circuit chip 2 was moved while controlling its position with the personal computer at a pitch P of 50 ($\mu$m), as shown in the outer appearance perspective view of FIG. 4, such that the laser finally, uniformly irradiated the whole remaining sealing resin portions 1a on the integrated circuit chip 2.

The whole integrated circuit was dipped in acetone 8 filled in advance in a glass beaker 70, and was subjected to a commercially available ultrasonic cleaner 30 for about 1 min. After that, this integrated circuit chip was removed from the beaker 70, and its surface was observed with the metallurgical microscope. It was confirmed that the resin portions 1a and scorched resin, which were left on the surface of the integrated circuit chip 2 after former laser irradiation, were removed, and that inversely the polyimide layers 7 or aluminum interconnections were not removed or moved.

As described above, according to the second embodiment, the time of the laser irradiation step was shortened to ⅓ that of a case wherein the laser irradiation position was manually removed.

The third embodiment of the present invention will be described with reference to FIGS. 2A to 2D, and FIG. 5. The third embodiment is different from the second embodiment in that, in the step of drilling and removing sealing resin 1 of the integrated circuit, an electric grinder and cooling water are used. More specifically, an opening apparatus of FIG. 5 is different from that of FIG. 3 in that it has an electric grinder 21 serving as a drilling means for drilling the sealing resin 1, and a nozzle 19 for supplying a fluid, which mainly dissipates heat generated during drilling, onto a sample 10. A description on portions identical to those of FIG. 3 will be omitted.

While cooling water prepared in advance was sprayed from a nozzle 19 toward a whole integrated circuit to cool it, so heat is not excessively conducted to a polyimide layer 7, the sealing resin 1 on the surface of an integrated circuit chip 2 was drilled by using the electric grinder 21 until gold balls 4 of gold wires 5 of the integrated circuit chip 2 were seen.

After a later laser irradiation step was ended, the polyimide layer 7 was experimentally observed with a stereomicroscope 15. It was confirmed that thermal fusion and decomposition of the polyimide layer were not caused by use of the electric grinder 21.

The laser irradiation step was performed, with moving a program-controlled stage identical to that described above, by moving the stage with the same program as that described above, while an output-energy-adjusted laser irradiated the stage. The whole integrated circuit was dipped in acetone 8 filled in advance in a glass beaker 70, and was subjected to a commercially available ultrasonic cleaner 30 for about 1 min. After that, this integrated circuit chip was removed from the beaker 70, and its integrated circuit chip 2 portion was observed with the metallurgical microscope. It was confirmed that resin portions 1a and scorched resin, which were left on the surface of the integrated circuit chip 2 after former laser irradiation, were removed, and that inversely the polyimide layers and aluminum interconnections were not removed or moved.

As described above, according to the third embodiment, in addition to time reduction in the laser irradiation step in the second embodiment, a time for drilling operation was shortened to ½ that of the second embodiment.

Figure 6:
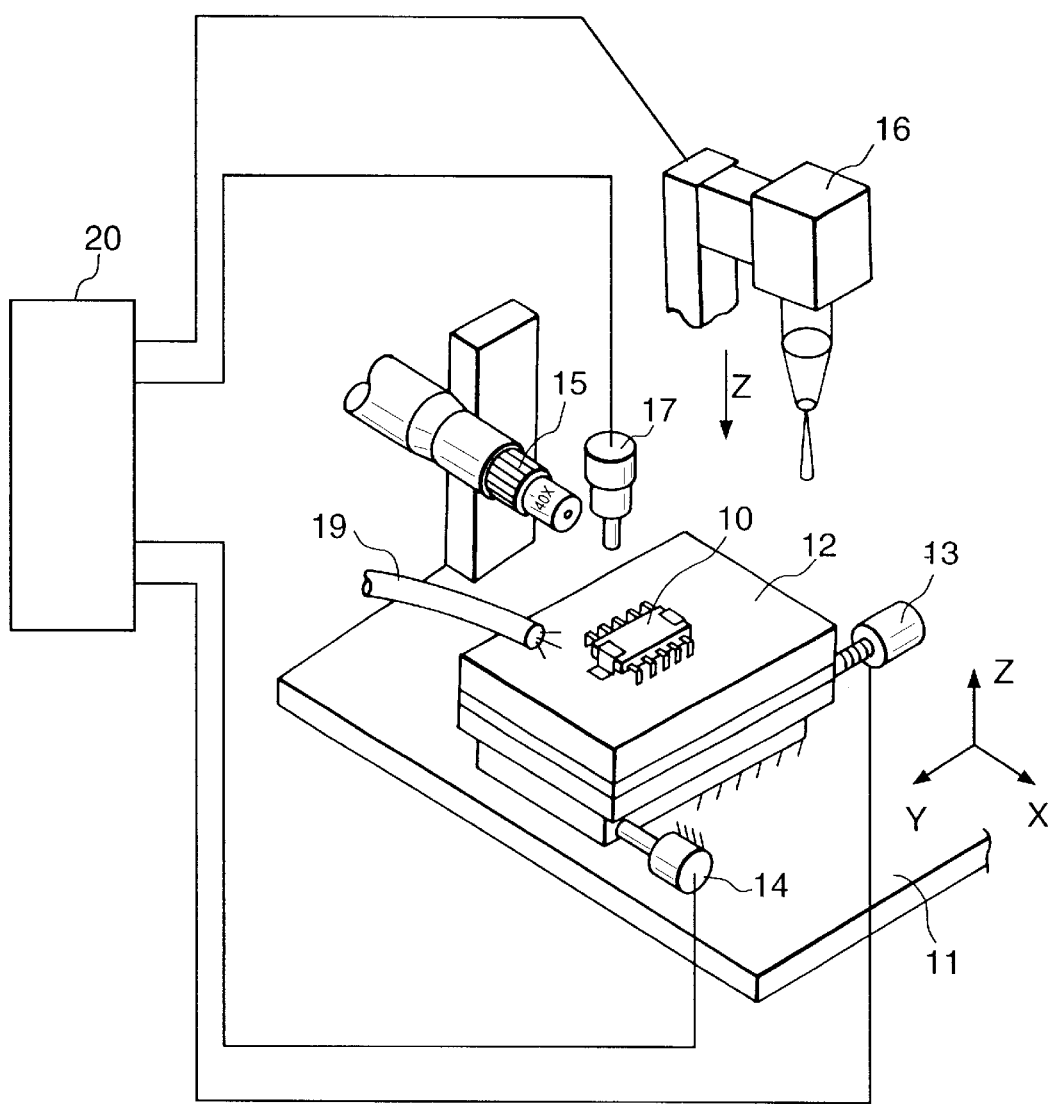
FIG. 6 is a perspective view of the outer appearance of an opening apparatus according to the fourth embodiment of the present invention.

The fourth embodiment of the present invention will be described with reference to FIGS. 2A to 2D and FIGS. 6 and 7. The fourth embodiment is different from the third embodiment in that, in the step of drilling and removing sealing resin 1 of an integrated circuit, an end mill 17 is used in place of an electric grinder. More specifically, an opening apparatus shown in FIG. 6 is different from that of FIG. 5 in that it has the end mill 17 serving as a drilling means for drilling the sealing resin 1. The end mill 17 can be moved in a Z direction by a support column fixed onto a base 11, so that it can perform drilling to a predetermined depth. A description on portions that are identical to those of FIG. 5 will be omitted.

Figure 7:
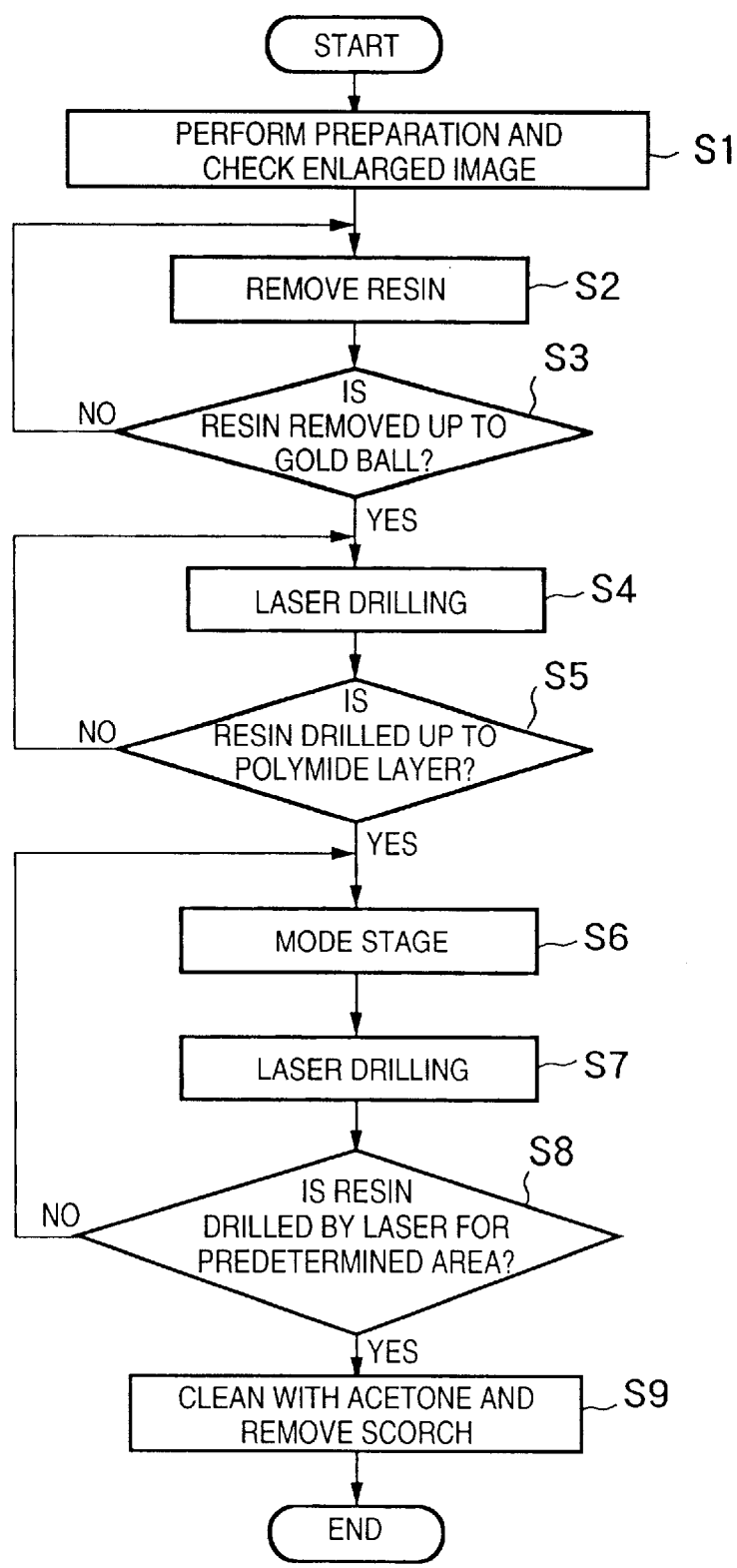
FIG. 7 is a flow chart of the operation of the opening apparatus shown in FIG. 6.

FIG. 7 is a flow chart of the operation of the fourth embodiment performed by using the apparatus shown in FIG. 6.

Referring to FIG. 7, a preparation of setting an integrated circuit chip as the sample on an X-Y stage 12, focusing a microscope 15 with the machining target surface, and starting the end mill 17 is performed in step S1. Successively, in step S2, the sealing resin 1 is removed while supplying cooling water from a nozzle 19, moving the end mill 17 downward along the Z-axis, and monitoring the machining depth with the microscope. When it is confirmed in step S3 that the gold balls are partly exposed, drilling is ended.

After that, in step S4, the end mill 17 is retreated, a laser irradiation unit 16 is positioned above the X-Y stage 12, the integrated circuit chip 2 is partially drilled by laser irradiation up to a polyimide layer 7 serving as a layer/film member.

After that, the X-Y stage 12 is moved in step S6, and intermittent laser machining is performed at a predetermined pitch P, as shown in the outer appearance perspective view of, e.g., FIG. 3. This operation is repeated until machining of a predetermined area is ended in step S8.

The sample obtained by machining in the above manner is removed from the X-Y stage 12 and is put in a container 70 storing acetone. Ultrasonic vibration is applied to the container 70, thereby removing carbonized resin portions which are left after laser machining (step S9).

After that, the sample is removed from the container 70 and cleaned. Then, failure analysis and the like of the integrated circuit are performed.

As described above, when a sample in which an integrated circuit chip, using polyimide to form its protective film and interlevel film and sealed with a resin, is to be opened, sealing resin on the upper surface side of the integrated circuit chip is sequentially drilled and removed to be left in an amount corresponding to a predetermined thickness. Every time the position of the integrated circuit chip is shifted, remaining sealing resin is repeatedly irradiated witch a YAG laser. After that, the sample is dipped in a liquid that does not chemically dissolve the polyimide layers, and is vibrated in an ultrasonic cleaner, thereby completely removing the sealing resin. The thickness of the remaining sealing resin is set to be equal to the diameter of each gold ball connected to each gold wire of the integrated circuit chip, and the output energy of the laser is set to 90 mJ or less. As a result, the resin-sealed integrated circuit chip can be opened without adversely affecting the polyimide layers.

More specifically, the resin on the upper surface side of the integrated circuit chip can be removed without chemically dissolving the polyimide layers and moving the aluminum interconnections formed in the polyimide layers. Therefore, anyone can grasp the aluminum interconnection structure and observe a disconnected aluminum interconnection.

As has been described above, according to the present invention, there is provided a method and apparatus for opening a resin-sealed body with which, when failure analysis and the like of a predetermined circuit including an integrated circuit are to be performed, movement of an upper aluminum interconnection is prevented and excessive drilling and removal are prevented, so that an aluminum interconnection structure can be grasped and a disconnected aluminum interconnection can be observed.

As many apparently widely different embodiments of the present invention can be made without departing from the spirit and scope thereof, it is to be understood that the invention is not limited to the specific embodiments thereof except as defined in the appended claims.

What is claimed is:

1. A method of opening a resin-sealed body obtained by sealing a predetermined circuit, including an integrated circuit covered with a layer/film member, a gold wire connecting said integrated circuit with a lead, a gold ball connecting said gold wire with said integrated circuit and a sealing resin, comprising the steps of:

a first drilling step comprising continuously drilling the sealing resin on said layer/film member with a drilling apparatus comprising one of a metal file, sand paper, an electrical grinder or an end mill and observing an enlarged drilling site via a microscope until said sealing resin is drilled to a depth corresponding to a height of said gold ball;

a second drilling step comprising partially drilling the drilled sealing resin with a laser irradiation apparatus by laser irradiation from the depth corresponding to the height of said gold ball up to said layer/film member; and a removing step comprising removing remaining sealing resin from said layer/film member with a container apparatus which stores a liquid that does not dissolve said layer/film member, said resin-sealed body being dipped in the liquid and ultrasonic vibration being applied to said container apparatus.

2. The method according to claim 1, wherein the second drilling step further comprises performing partial drilling while shifting an irradiation position with a YAG laser generator having a moving mechanism.

3. The method according to claim 2, wherein partial drilling is performed with one stroke.

4. The method according to claim 2, wherein said layer/film member is made of polyimide, and in the step using said laser irradiation means, said YAG laser generator has an output energy of not more than 90 mJ.

5. The method according to claim 1, wherein in the step using said container apparatus, the liquid does not chemically dissolve said layer/film member.

* * * * *

UNITED STATES PATENT AND TRADEMARK OFFICE
CERTIFICATE OF CORRECTION

PATENT NO. : 6,579,376 B1  Page 1 of 1
DATED : June 17, 2003
INVENTOR(S) : Kenji Ikkai et al.

It is certified that error appears in the above-identified patent and that said Letters Patent is hereby corrected as shown below:

<u>Column 3,</u>
Line 10, "integrated" should read -- integrated circuit --;
Line 50, "sample." should read -- sample --; and
Line 66, "(motodriver)" should read -- (motor driver) --.

<u>Column 5,</u>
Line 23, "an." should read -- an --.

<u>Column 7,</u>
Line 9, "witch" should read -- with --.

Signed and Sealed this

Twenty-seventh Day of January, 2004

JON W. DUDAS
*Acting Director of the United States Patent and Trademark Office*